(12) United States Patent
Yang et al.

(10) Patent No.: US 8,361,838 B2
(45) Date of Patent: Jan. 29, 2013

(54) SEMICONDUCTOR PACKAGE AND METHOD FOR MANUFACTURING THE SAME VIA HOLES IN SEMICONDUCTOR CHIP FOR PLURALITY STACK CHIPS

(75) Inventors: Seung Taek Yang, Seoul (KR); Min Suk Suh, Seoul (KR); Seung Hyun Lee, Gyeonggi-do (KR); Jong Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/241,812

(22) Filed: Sep. 23, 2011

(65) Prior Publication Data

US 2012/0009736 A1 Jan. 12, 2012

Related U.S. Application Data

(62) Division of application No. 12/244,322, filed on Oct. 2, 2008, now Pat. No. 8,049,341.

(30) Foreign Application Priority Data

Mar. 12, 2008 (KR) .................. 10-2008-0023041

(51) Int. Cl.
*H01L 21/00* (2006.01)
*H01L 23/48* (2006.01)
(52) U.S. Cl. ....................... 438/109; 257/777
(58) Field of Classification Search .............. None
See application file for complete search history.

(56) References Cited

U.S. PATENT DOCUMENTS

| | | | |
|---|---|---|---|
| 5,399,898 A * | 3/1995 | Rostoker | ............ 257/499 |
| 5,481,133 A | 1/1996 | Hsu | |
| 6,222,276 B1 * | 4/2001 | Bertin et al. | ............ 257/778 |
| 6,444,576 B1 | 9/2002 | Kong | |
| 6,538,333 B2 | 3/2003 | Kong | |
| 6,577,013 B1 | 6/2003 | Glenn et al. | |
| 6,720,661 B2 * | 4/2004 | Hanaoka et al. | ............ 257/774 |
| 6,780,751 B2 * | 8/2004 | Fay | ............ 438/613 |

(Continued)

FOREIGN PATENT DOCUMENTS

| KR | 1020010060208 A | 7/2001 |
|---|---|---|
| KR | 1020050030553 A | 3/2005 |

(Continued)

OTHER PUBLICATIONS

USPTO RR mailed May 12, 2011 in connection with U.S. Appl. No. 12/244,322.

(Continued)

*Primary Examiner* — Alonzo Chambliss
(74) *Attorney, Agent, or Firm* — Ladas & Parry LLP

(57) ABSTRACT

A stacked semiconductor package and a method for manufacturing the same are presented which exhibit a reduced electrical resistance and an increased junction force. The semiconductor package includes at least two semiconductor chips stacked upon each other. Each semiconductor chip has a plurality of bonding pads formed on upper surfaces and has via-holes. First wiring lines are located on the upper surfaces of the semiconductor chips, on the surfaces of the via-holes, and respectively connected onto their respective bonding pads. Second wiring lines are located on lower surfaces of the semiconductor chips and on the surfaces of the respective via-holes which connect to their respective first wiring lines. The semiconductor chips are stacked so that the first wiring lines on an upper surface of an upwardly positioned semiconductor chip are respectively joined with corresponding second wiring lines formed on a lower surface of a downwardly positioned semiconductor chip.

11 Claims, 6 Drawing Sheets

U.S. PATENT DOCUMENTS

| | | |
|---|---|---|
| 6,908,785 B2 | 6/2005 | Kim |
| 6,962,865 B2 * | 11/2005 | Hanaoka et al. ............. 438/618 |
| 7,102,219 B2 * | 9/2006 | Hanaoka et al. ............. 257/686 |
| 7,253,527 B2 * | 8/2007 | Tanida et al. ................ 257/774 |
| 7,531,905 B2 | 5/2009 | Ishino et al. |
| 7,732,328 B2 | 6/2010 | Kwon et al. |
| 7,791,175 B2 * | 9/2010 | Pyeon .......................... 257/621 |
| 7,795,139 B2 | 9/2010 | Han et al. |
| 7,858,439 B2 | 12/2010 | Kim |
| 8,044,516 B2 * | 10/2011 | Park ............................. 257/772 |
| 8,049,341 B2 * | 11/2011 | Yang et al. ................... 257/777 |
| 2003/0107119 A1 | 6/2003 | Kim |
| 2007/0284729 A1 | 12/2007 | Kwon et al. |
| 2009/0008798 A1 * | 1/2009 | Yoshida et al. .............. 257/777 |
| 2009/0108469 A1 | 4/2009 | Kang et al. |
| 2012/0056322 A1 * | 3/2012 | Saigoh et al. ................ 257/737 |

FOREIGN PATENT DOCUMENTS

| | | |
|---|---|---|
| KR | 100728978 B1 | 6/2007 |

OTHER PUBLICATIONS

USPTO NOA mailed Jul. 26, 2011 in connection with U.S. Appl. No. 12/244,322.

* cited by examiner

SEMICONDUCTOR PACKAGE AND METHOD FOR MANUFACTURING THE SAME VIA HOLES IN SEMICONDUCTOR CHIP FOR PLURALITY STACK CHIPS

CROSS-REFERENCE TO RELATED APPLICATIONS

The present application claims priority to Korean patent application number 10-2008-0023041 filed on Mar. 12, 2008, which is incorporated herein by reference in its entirety.

BACKGROUND OF THE INVENTION

The present invention relates generally to a semiconductor package and a method for manufacturing the same, and more particularly, to a semiconductor package and a method for manufacturing the same that exhibits a reduced electric resistance and an increased junction force.

These days, the semiconductor industry is actively engaged in developing more cost efficient ways of manufacturing is semiconductor products that exhibit high reliability. Light weight, miniaturization, high speed operation, multi-functionality, and high performance features are also being actively developed by the semiconductor industry. In achieving these desired features, semiconductor package forming techniques are considered as one promising aspect in this rapidly developing and important technology in the semiconductor industry.

The semiconductor package forming techniques are designed to produce semiconductor chips that have their circuit patterns protected therein from outside circumstances. Further, semiconductor package forming techniques are designed to produce semiconductor packages that mount easily to a substrate so that the operational reliability of the semiconductor chips can be secured. The semiconductor package forming techniques include processes, such as, semiconductor chip attaching processes, wire bonding processes, molding processes and trimming/forming processes. The semiconductor package forming techniques can be either conducted at the chip level or the wafer level.

Recently, techniques for forming semiconductor packages by stacking at least two semiconductor chips or packages have gained much interest in achieving many of the above desired features. These stack package techniques have been developed to accomplish miniaturization, high capacity and high mounting efficiency in semiconductor packages. The stack package techniques promise to provide a semiconductor product that can realize a memory capacity greater than semiconductor products made from more conventional integration processes partly because mounting area utilization efficiency can be improved.

In stack packages, electrical connections are formed using metal wires, bumps or through-electrodes between semiconductor chips or packages and a substrate or between semiconductor chips or packages. Of particular note are stack packages that use through-electrodes in semiconductor chips or packages in which electrical degradation of the resultant stack packages can be avoided or minimized. As a consequence of using through-electrodes in stack packages, the resultant operation speed can be increased and the size of the stack package can be miniaturized. Accordingly, interest in further developing these types of stack packages has been grown.

However, stack packages that use through-electrodes are not without problems. In particular, because through-electrodes of upper and lower semiconductor chips or packages are joined with each other by different kind of metals such as solders, then increases in electric resistance and in electrical reliability degradation problems are likely to occur due to such things as deterioration brought about by substantial brittleness.

Further regarding stack packages that use through-electrodes, electrical and physical connections formed have small junction areas. As a consequence, these connections are likely to break or fail due to external forces such as external physical shocks. As a result, these types of stack packages that use through-electrodes are prone to suffering degradation to their reliability. It is known that the junction reliability of the stack packages can be improved by using adhesive tapes or filler materials. However, using adhesive tapes or filler materials necessarily results in additional processes that consequently increase the fabrication cost and/or the manufacturing time needed to assure that these semiconductor package products do not suffer post-manufacture deteriorate.

Moreover, because the junction areas of stack packages that incorporate through-electrodes are small, the electric resistance across these small junction areas increases. Accordingly, these semiconductor products cannot be used in high-performance electronic products that require high signal transmitting speeds.

SUMMARY OF THE INVENTION

Embodiments of the present invention are directed to a semiconductor package and a method for manufacturing the same which can result in reducing electric resistances and increasing junction force.

In one aspect of the present invention, a semiconductor package comprises at least two semiconductor chips stacked upon each other and having a plurality of bonding pads formed on upper surfaces thereof and via-holes defined through them. First wiring lines are located on the upper surfaces of the semiconductor chips, on surfaces of the via-holes, and are respectively connected onto the bonding pads. Second wiring lines are located on lower surfaces of the semiconductor chips to connect with their respective first wiring lines. The semiconductor chips are stacked so that first wiring lines formed on an upper surface of an upwardly positioned semiconductor chip are respectively joined together with corresponding second wiring lines formed on a lower surface of a downwardly positioned semiconductor chip.

The first wiring lines located on the upper surfaces and second wiring lines located on lower surfaces of the semiconductor chips may have substantial mirror images with respect to each other.

The first and second wiring lines may have a thickness of about 1~3 μm.

The first and second wiring lines may be formed of at least one of or an alloy containing at least one of gold (Au), copper (Cu), aluminum (Al), tin (Sn), and nickel (Ni).

In another aspect of the present invention, a method for manufacturing a semiconductor package comprises the steps of defining a plurality of via-holes in at least two semiconductor chips which have a plurality of bonding pads on upper surfaces thereof; forming first wiring lines on the upper surfaces of the semiconductor chips, on surfaces of the via-holes, and onto the respective bonding pads; forming second wiring lines on lower surfaces of the semiconductor chips to respectively connect with the first wiring lines; and stacking the semiconductor chips so that first wiring lines formed on an upper surface of an upwardly positioned semiconductor chip are respectively joined with corresponding second wiring lines formed on a lower surface of a downwardly positioned semiconductor chip.

The first wiring lines located on the upper surfaces and second wiring lines located on lower surfaces of the semiconductor chips may be formed to have substantial mirror images with respect to each other.

The first and second wiring lines may be formed using chemical vapor deposition or physical vapor deposition.

The first and second wiring lines are formed to have a thickness of about 1~3 μm.

The first and second wiring lines are formed of at least one of or an alloy containing at least one of gold (Au), copper (Cu), aluminum (Al), tin (Sn), and nickel (Ni).

The step of forming the first wiring lines comprises the steps of forming a first metal layer on the upper surfaces of the semiconductor chips and on surfaces of the respective via-holes; forming mask patterns on an upper surface of the first metal layer to cover wiring line forming areas for respectively connecting the bonding pads and the via-holes with each other; etching exposed portions of the first metal layer; and removing the mask patterns.

The step of forming the second wiring lines comprises the steps of forming a second metal layer on lower surfaces of the semiconductor chips connect with the first wiring lines; forming mask patterns on an upper surface of the second metal layer to cover wiring line forming areas; etching exposed portions of the second metal layer; and removing the mask patterns.

After the step of forming the second wiring lines and before the step of stacking the semiconductor chips, the method may further comprise the step of substantially removing impurities present on surfaces of the semiconductor chips, the first and the second wiring lines.

The step of removing the impurities may be performed using plasma.

The step of removing the impurities on the surfaces of the semiconductor chips and the step of stacking the semiconductor chips may be implemented in situ.

The step of stacking the semiconductor chips may be implemented using a hot stamping process.

The step of defining the via-holes in the semiconductor chips through the step of stacking the semiconductor chips are may be implemented at the wafer level.

DESCRIPTION OF SPECIFIC EMBODIMENTS

Hereafter, the specific embodiments of a semiconductor package and a method for manufacturing the same according to the present invention will be described in detail with reference to the accompanying drawings.

Figure 1:
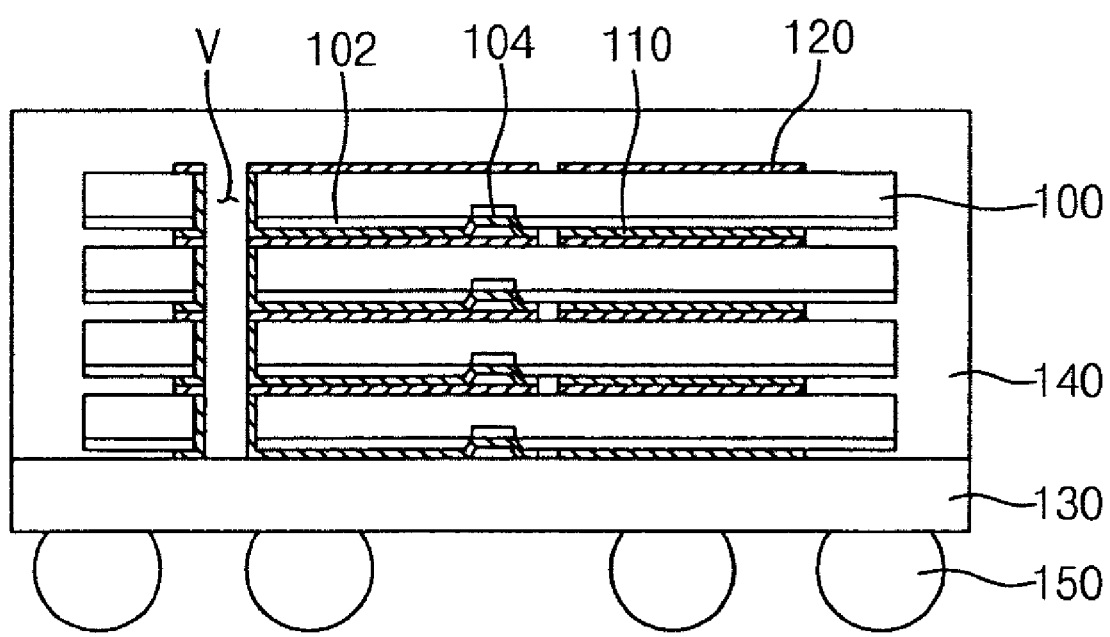
FIG. 1 is a stack package in accordance with an embodiment of the present invention.

FIG. 1 depicts a stack package in accordance with an embodiment of the present invention.

Referring to FIG. 1, the stack package according to the present invention includes a plurality of semiconductor chips 100 each of which has first wiring lines 110 formed on the upper surface thereof and second wiring lines 120 formed on the lower surface thereof. The first wiring lines 110 located on the upper surface and second wiring lines located on the lower surface 120 have mirror images such that they are substantially symmetric to each other.

Each semiconductor chip 100 has a plurality of bonding pads 104 on the upper surface thereof, which are delimited by a protective layer 102. Each semiconductor chip 100 further has via-holes V which may correspond to the number of the bonding pads 104. Alternatively, each semiconductor chip 100 may have more via-holes V than the number of the bonding pads 104.

The first wiring lines 110 are placed on the upper surface of each semiconductor chip 100, including the surfaces of the via-holes V defined through the semiconductor chip 100, and are respectively connected to corresponding bonding pads 104. The second wiring lines 120 are placed on the lower surface of each semiconductor chip 100 have mirror images with respect to the first wiring lines 110 located on the upper surface such the second wiring lines 120 are symmetrically eclipsed with the first wiring lines 110. The second wiring lines 120 are respectively operatively connected to corresponding first wiring lines 110 using the via-holes V.

The first and second wiring lines 110 and 120 have thicknesses of about 1~3 μm and are formed of at least one of or an alloy containing at least one of gold (Au), copper (Cu), aluminum (Al), tin (Sn), and nickel (Ni).

The semiconductor chips 100 are stacked such that the first wiring lines 110 formed on the upper surface of an upwardly positioned semiconductor chip 100 are respectively operatively joined together with the corresponding second wiring lines 120 formed on a lower surface of a downwardly positioned semiconductor chip 100.

The stacked semiconductor chips 100 are shown attached to a substrate 130. A molding member 140 is shown applied to the is upper surface of the substrate 130 for covering the stacked semiconductor chips 100, and outside connection terminals 150 such as solder balls are shown attached to the lower surface of the substrate 130.

FIGS. 2A through 2J are views explaining a method for manufacturing a stack package in accordance with another embodiment of the present invention.

Figure 2A:
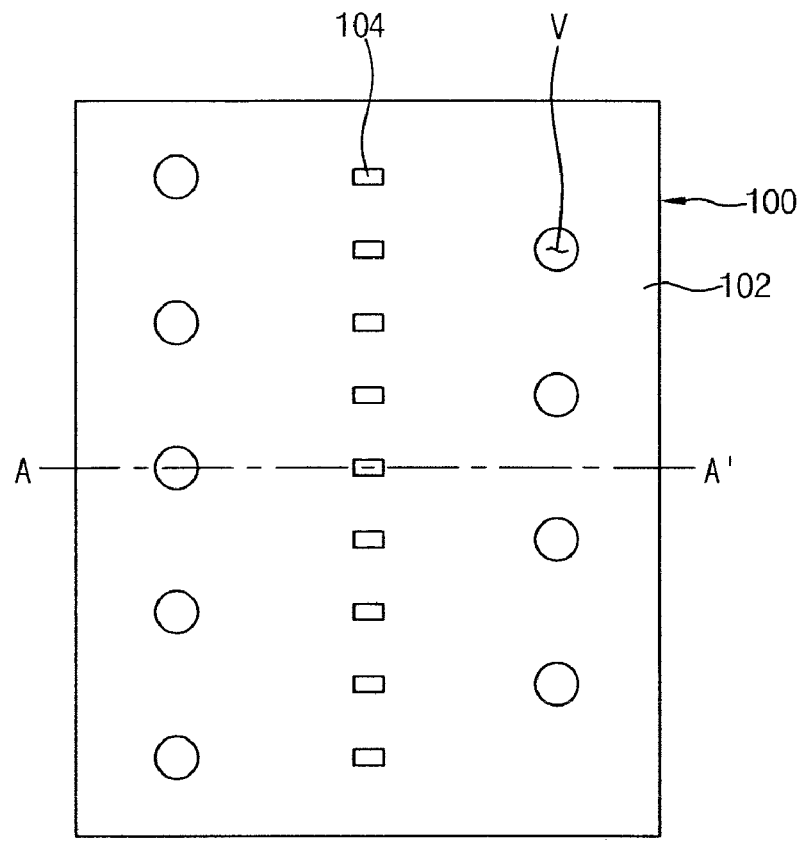
FIGS. 2A through 2J are views explaining a method for manufacturing a stack package in accordance with another embodiment of the present invention.
Figure 2B:
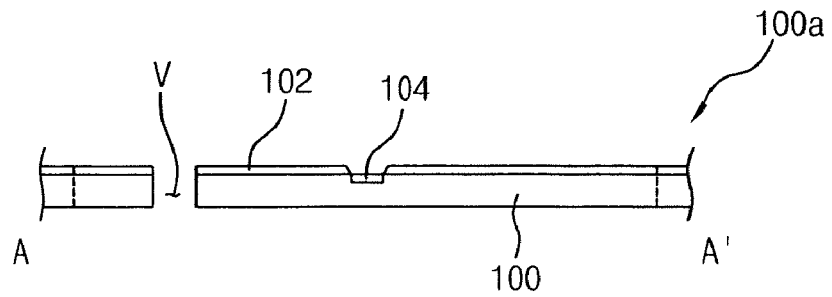

Referring to FIGS. 2A and 2B, a plurality of via-holes V are defined through semiconductor chips 100 of a wafer 100a. Each semiconductor chip 100 has bonding pads 104 delimited by a protective layer 102. The number of via-holes V can correspond to the number of bonding pads 104. In order to allow wiring lines to be easily formed in a subsequent wiring line forming process, the via-holes V may be alternately located along each semiconductor chip 100 when viewed from the top.

Figure 2C:
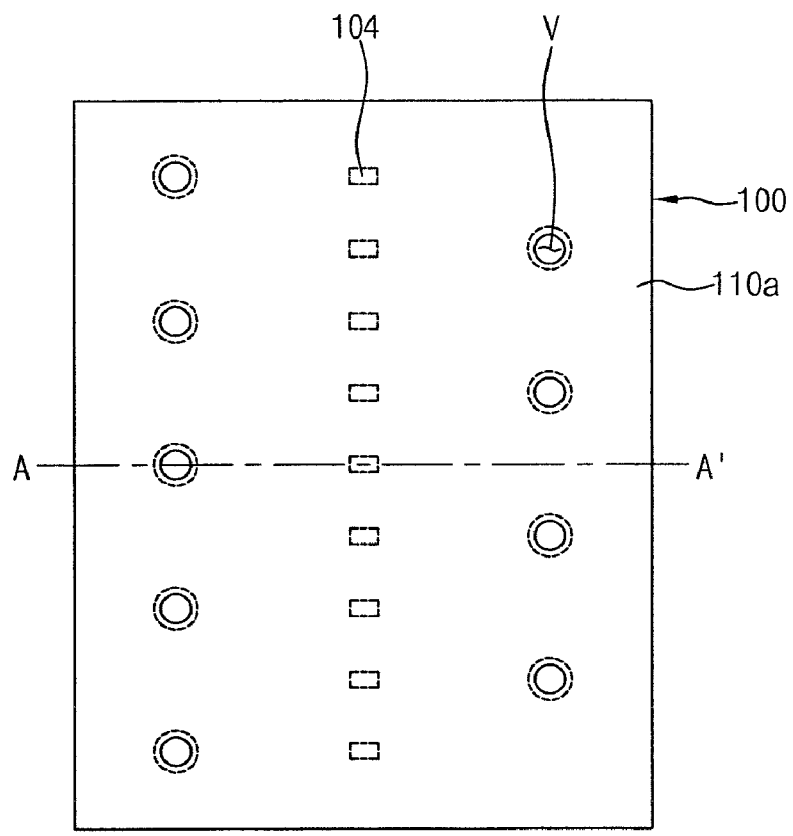
Figure 2D:
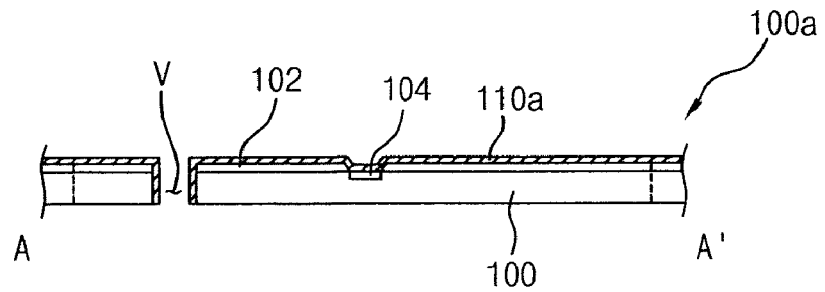

Referring to FIGS. 2C and 2D, a first metal layer 110a is shown formed on the surfaces of the via-holes V and the upper surface of the wafer 100a. The first metal layer 110a is formed using any known deposition technique such as a chemical vapor deposition or a physical vapor deposition. The first metal layer 110a can also be formed using sputtering which is also a well-known metal deposition technique in the semiconductor fabrication arts. The first metal layer 110a is shown formed on the entire upper surface of the wafer 100a and can have a thickness of about 1~3 μm. The first metal layer 110a can be formed of at least one of or an alloy containing at least one of gold (Au), copper (Cu), aluminum (Al), tin (Sn), and nickel (Ni).

Figure 2E:
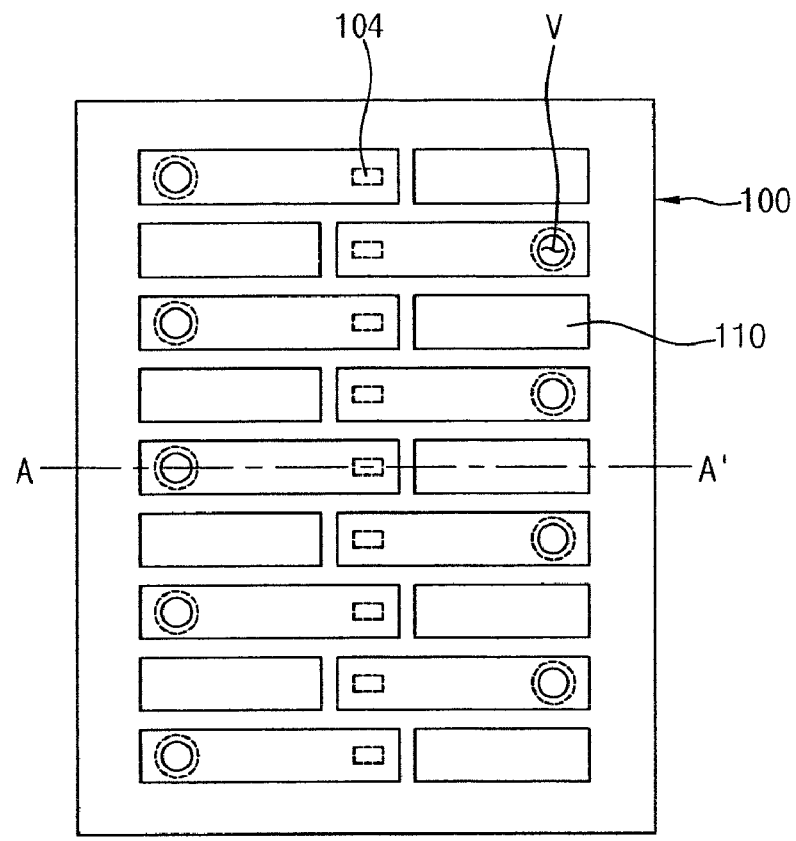
Figure 2F:
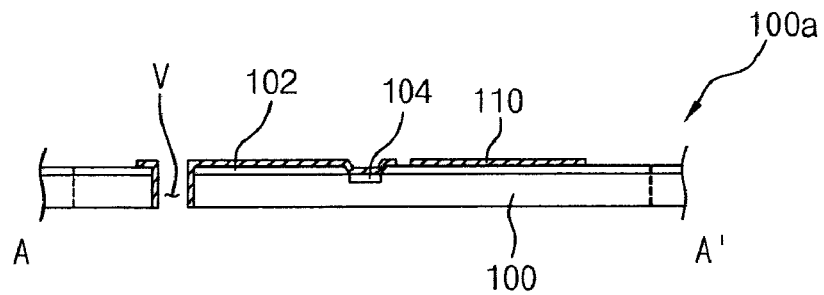

Referring now to FIGS. 2E and 2F, mask patterns (not shown) made of photoresist are formed on the first metal layer 110a of the wafer 100a including the plurality of semiconductor chips 110, to cover and to define wiring line forming areas.

Next, subsequent to performing an etching process for the exposed portions of the first metal layer 110a, the first wiring lines 110 are formed on the upper surfaces of the semiconductor chips 100 and on the surfaces of the via-holes V such that the first wiring lines 110 are respectively connected with the bonding pads 104.

Figure 2G:
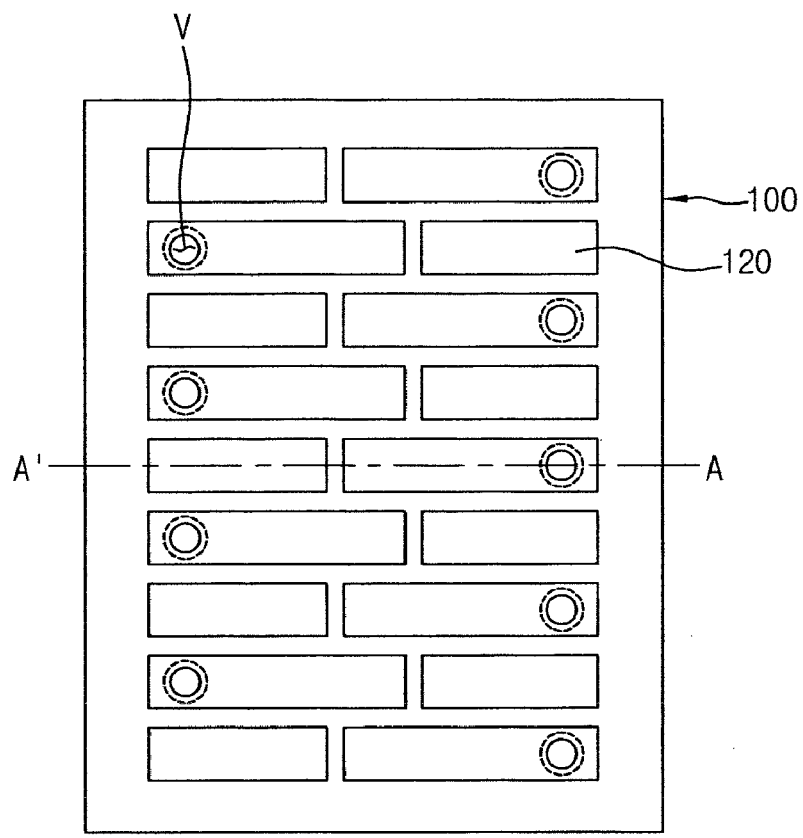
Figure 2H:
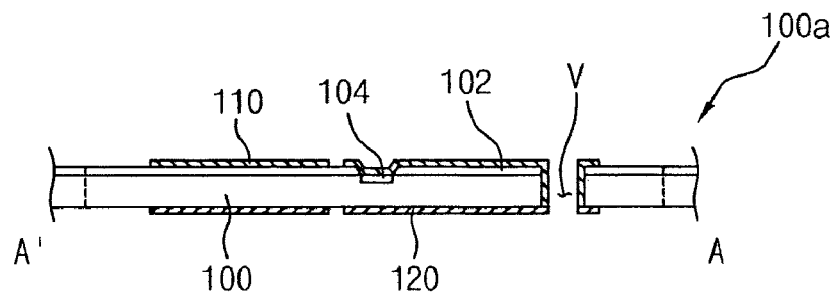

Referring to FIGS. 2G and 2H, the mask patterns (not shown) are subsequently removed. Then, second wiring lines 120 are formed on the lower surfaces of the semiconductor chips 100 so that the second wiring lines 120 are electrically connected with the first wiring lines 110 formed on the surfaces of the via-holes V. The second wiring lines 120 have a structure substantially corresponding to the structure of the first wiring lines 110 on the to upper surfaces. That is, the second wiring lines 120 are substantial mirror images of the first wiring lines 110.

The second wiring lines 120 are usually formed in the same manner as the first wiring lines 110 as shown in FIGS. 2C through 2F. The second wiring lines 120 can also be formed to have a thickness of about 1~3 μm using at least one of or an alloy containing at least one of gold (Au), copper (Cu), aluminum (Al), tin (Sn), and nickel (Ni).

Figure 2I:
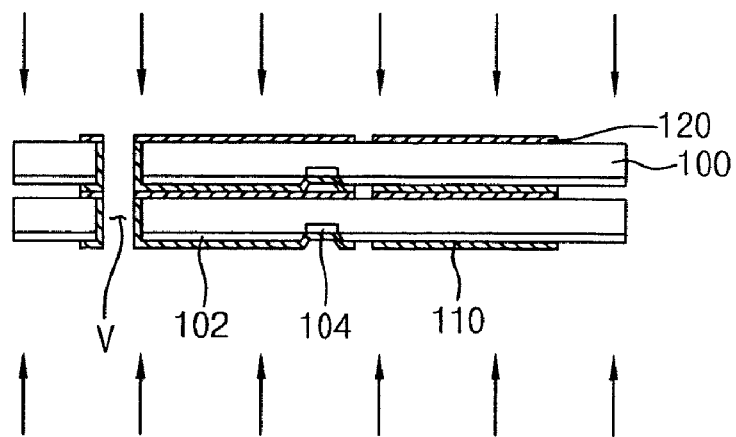

Referring to FIG. 2I, the semiconductor chips 100 having the formed first and second wiring lines 110 and 120 on the upper and lower surfaces are then subsequently cut away from the wafer 100a into individual semiconductor chips 100.

Then, in order to remove impurities such as an oxide layer present on the surfaces of the semiconductor chips 100 formed with the first and second wiring lines 110 and 120, a surface treatment process is then conducted on the individual semiconductor chips 100. The surface treatment process can be conducted using plasma in a vacuum state after loading the semiconductor chips 100 into a chamber.

Following the removal of the surface impurities using plasma in the vacuum state, the semiconductor chips 100 are then stacked on each other such that the first wiring lines 110 formed on the upper surface of an upwardly positioned semiconductor chip 100 are respectively joined together with corresponding second wiring lines 120 formed on the lower surface of a downwardly positioned semiconductor chip 100. At this time, the junction between the first and second wiring tines 110 can be made using a hot stamping process. The first and second wiring lines 110 and 120 are easily joined with each other since they have substantially symmetric structures.

The process for treating the surfaces of the semiconductor chips 100 using plasma and the process for stacking the semiconductor chips 100 are conducted in situ.

Figure 2J:
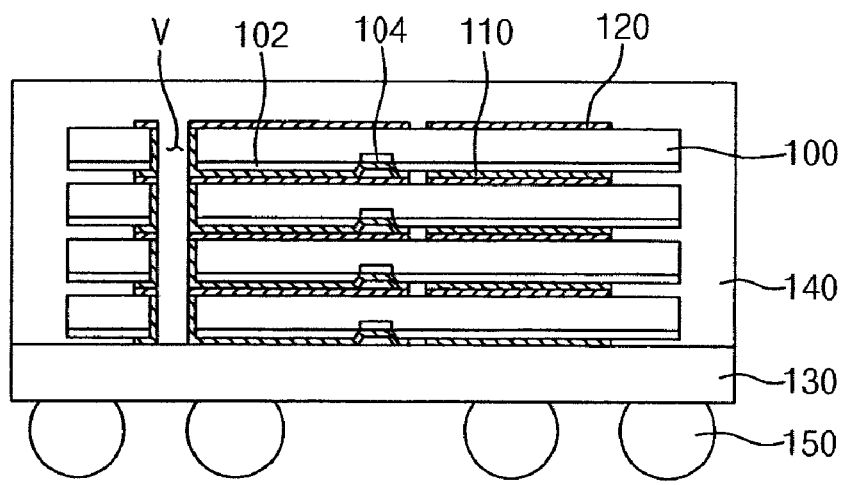

Referring to FIG. 2J, the stacked semiconductor chips 100 are shown attached to a substrate 130. Afterwards a molding member 140 is applied to cover the semiconductor chips 100 stacked on the upper surface of the substrate 130. The outside connection terminals 150, such as, solder balls can then be attached to the lower surface of the substrate 130. Whereby the manufacture of the stack package according to an embodiment of the present invention is completed.

Instead of the step shown in FIG. 2I, the semiconductor package according to the present invention can be manufactured in a manner such that a cutting process is conducted after stacking a plurality of wafers formed with first and second wiring lines.

As is apparent from the above description, in the semiconductor package according to the present invention, first and second wiring lines having mirror images are formed on the upper and lower surfaces of semiconductor chips to be stacked. The semiconductor chips are then stacked in a manner such that the first and second wiring lines are joined with each other. According to this, in the semiconductor package, since electrical connections are formed using substantially the same metallic material, electric is resistance can be decreased.

Also, in the semiconductor package according to the present invention, due to the fact that electrical and physical connections are formed using wiring lines which have substantially the same area and size and are substantially symmetric to each other, junction force can be increased. According it is not necessary to interpose an adhesive tape or a filler material there between the stacked semiconductor chips. Accordingly, the time and the cost for manufacturing a semiconductor package can be decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor package, comprising the steps of:
    defining a plurality of via-holes in at least two semiconductor chips in which each semiconductor chip has a plurality of bonding pads on upper surfaces thereof;
    forming first wiring lines on the upper surfaces of each of the semiconductor chips and on surfaces of the via-holes to be respectively connect to the bonding pads;
    forming second wiring lines on lower surfaces of the semiconductor chips so that the second wiring lines on lower surfaces are respectively connected with the first wiring lines on the respective upper surfaces; and
    stacking the semiconductor chips so that first wiring lines formed on an upper surface of an upwardly positioned semiconductor chip are respectively joined together with corresponding second wiring lines formed on a lower surface of a downwardly positioned semiconductor chip, wherein the step of stacking the semiconductor chips is implemented using a hot stamping process.

2. The method according to claim 1, wherein the first wiring lines located on the upper surfaces and second wiring lines located on lower surfaces of the semiconductor chips are formed having substantial mirror images with respect to each other.

3. The method according to claim 1, wherein the first and second wiring lines are formed using chemical vapor deposition or physical vapor deposition.

4. The method according to claim 1, wherein the first and second wiring lines are formed to have a thickness of about 1~3 μm.

5. The method according to claim 1, wherein the first and second wiring lines are formed of at least one of or an alloy containing at least one of gold (Au), copper (Cu), aluminum (Al), tin (Sn), and nickel (Ni).

6. The method according to claim 1, wherein the step of forming the first wiring lines comprises the steps of:
    forming a first metal layer on the upper surfaces of the semiconductor chips and on surfaces of the via-holes;
    forming mask patterns on an upper surface of the first metal layer to cover wiring line forming areas for respectively connecting the bonding pads and the via-holes with each other;
    etching exposed portions of the first metal layer; and
    removing the mask patterns.

7. The method according to claim 1, wherein the step of forming the second wiring lines comprises the steps of:
  forming a second metal layer on lower surfaces of the semiconductor chips to connect with the first wiring lines;
  forming mask patterns on an upper surface of the second metal layer on the lower surfaces of the semiconductor chips to cover wiring line forming areas;
  etching exposed portions of the second metal layer; and
  removing the mask patterns.

8. The method according to claim 1, wherein, after the step of forming the second wiring lines and before the step of stacking the semiconductor chips, the method further comprises the step of:
  substantially removing impurities away from surfaces of the semiconductor chips including the first and second wiring lines.

9. The method according to claim 8, wherein the step of removing the impurities is implemented using plasma.

10. The method according to claim 8, wherein the step of removing the impurities on the surfaces of the semiconductor chips and the step of stacking the semiconductor chips are implemented in situ.

11. The method according to claim 1, wherein the step of defining the via-holes in the semiconductor chips through the step of stacking the semiconductor chips is implemented at a wafer level.

* * * * *